United States Patent
Fang et al.

(10) Patent No.: US 7,478,355 B2
(45) Date of Patent: Jan. 13, 2009

(54) INPUT/OUTPUT CIRCUITS WITH PROGRAMMABLE OPTION AND RELATED METHOD

(75) Inventors: Hsin-Wo Fang, Taoyuan (TW); Ming-Jing Ho, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 359 days.

(21) Appl. No.: 10/709,665

(22) Filed: May 21, 2004

(65) Prior Publication Data

US 2005/0262461 A1 Nov. 24, 2005

(51) Int. Cl.
*G06F 17/50* (2006.01)
*G06F 7/38* (2006.01)
*H03K 19/00* (2006.01)
*H03K 19/173* (2006.01)

(52) U.S. Cl. ............ 716/13; 716/1; 716/2; 716/9; 716/12; 716/16; 716/17; 326/39; 326/41; 326/47

(58) Field of Classification Search ............ 716/1, 716/24, 5, 7–9, 11, 16–19; 365/100, 185.11; 326/39, 41, 47

See application file for complete search history.

(56) References Cited

U.S. PATENT DOCUMENTS

| | | | | |
|---|---|---|---|---|
| 5,350,704 A | * | 9/1994 | Anderson et al. | 438/129 |
| 5,452,229 A | * | 9/1995 | Shankar et al. | 716/17 |
| 5,550,839 A | * | 8/1996 | Buch et al. | 714/724 |
| 5,598,346 A | * | 1/1997 | Agrawal et al. | 716/16 |
| 5,612,891 A | * | 3/1997 | Butts et al. | 716/16 |
| 5,640,327 A | * | 6/1997 | Ting | 716/7 |
| 5,858,817 A | * | 1/1999 | Bansal | 438/129 |
| 5,987,086 A | * | 11/1999 | Raman et al. | 716/1 |
| 6,002,268 A | * | 12/1999 | Sasaki et al. | 326/41 |
| 6,052,014 A | * | 4/2000 | Maeda | 327/333 |
| 6,080,204 A | * | 6/2000 | Mendel | 716/7 |
| 6,102,964 A | * | 8/2000 | Tse et al. | 716/18 |
| 6,130,550 A | * | 10/2000 | Zaliznyak et al. | 326/39 |
| 6,167,558 A | * | 12/2000 | Trimberger | 716/16 |
| 6,175,952 B1 | * | 1/2001 | Patel et al. | 716/18 |
| 6,187,678 B1 | * | 2/2001 | Gaynes et al. | 438/667 |
| 6,195,788 B1 | * | 2/2001 | Leaver et al. | 716/18 |
| 6,260,177 B1 | * | 7/2001 | Lee et al. | 716/2 |
| 6,335,636 B1 | * | 1/2002 | Yeung et al. | 326/41 |
| 6,362,649 B1 | * | 3/2002 | McGowan | 326/41 |
| 6,437,839 B1 | * | 8/2002 | Cacharelis | 349/39 |
| 6,490,717 B1 | * | 12/2002 | Pedersen et al. | 716/18 |
| 6,536,030 B1 | * | 3/2003 | Tanaka | 716/17 |
| 6,604,228 B1 | * | 8/2003 | Patel et al. | 716/8 |
| 6,615,402 B2 | * | 9/2003 | Kaneko et al. | 716/16 |
| 6,625,688 B1 | * | 9/2003 | Fruehling et al. | 711/109 |
| 6,694,491 B1 | * | 2/2004 | Osann, Jr. et al. | 716/2 |
| 6,823,501 B1 | * | 11/2004 | Dahl | 716/9 |
| 6,823,502 B2 | * | 11/2004 | Wingren et al. | 716/9 |
| 6,870,395 B2 | * | 3/2005 | Schadt et al. | 326/41 |

(Continued)

*Primary Examiner*—Helen Rossoshek
(74) *Attorney, Agent, or Firm*—Winston Hsu

(57) ABSTRACT

A chip with programmable input/output (I/O) circuits has a plurality of layout layers including a plurality of same layouts in a plurality of positions of the layout layers so as to implement a plurality of sub-circuit cells with the same layout, and at least a connection layer having different layouts corresponding to the different positions of the layout layers so that the sub-circuit cells in different positions implement different circuit functions.

11 Claims, 4 Drawing Sheets

U.S. PATENT DOCUMENTS

| | | | |
|---|---|---|---|
| 6,873,185 B2* | 3/2005 | Cox .................................. 326/47 |
| 6,938,236 B1* | 8/2005 | Park et al. ......................... 716/17 |
| 7,020,860 B1* | 3/2006 | Zhao et al. ......................... 716/5 |
| 7,024,649 B2* | 4/2006 | Collmeyer et al. ............... 716/11 |
| 7,043,703 B2* | 5/2006 | Nation et al. ..................... 716/1 |
| 7,257,799 B2* | 8/2007 | McKenney et al. ............. 716/16 |
| 7,389,485 B1* | 6/2008 | Rahut et al. ...................... 716/12 |
| 2003/0112662 A1* | 6/2003 | Tanzawa et al. ............. 365/185.11 |
| 2003/0202397 A1* | 10/2003 | Saito et al. ........................ 365/200 |
| 2005/0076316 A1* | 4/2005 | Pierrat et al. ...................... 716/4 |
| 2005/0081177 A1* | 4/2005 | Beal et al. ......................... 716/17 |
| 2005/0091630 A1* | 4/2005 | Madurawe ........................ 716/16 |
| 2005/0149896 A1* | 7/2005 | Madurawe ........................ 716/17 |
| 2005/0235239 A1* | 10/2005 | Matsubara ........................ 716/10 |
| 2005/0257177 A1* | 11/2005 | Chen et al. ........................ 716/1 |
| 2005/0262460 A1* | 11/2005 | Goyal et al. ...................... 716/7 |
| 2006/0015828 A1* | 1/2006 | Bansal .............................. 716/1 |

* cited by examiner

INPUT/OUTPUT CIRCUITS WITH PROGRAMMABLE OPTION AND RELATED METHOD

BACKGROUND OF INVENTION

1. Field of the Invention

The present invention relates to a chip (e.g. IO circuit) with programmable function and method of implementing the same, and more particularly, to a chip capable of realizing different I/O functions by only altering the layouts of a metal connection layer and method of implementing the same.

2. Description of the Prior Art

Various electronic circuits formed in semiconductor chips have become a foundation of the information technology industry. Consequently, to reduce the cost and time of designing and manufacturing semiconductor chips has become a key target for the semiconductor manufacturers.

The manufacturing procedures of semiconductor chips are as follows. First, the circuit layouts are designed according to different functional requirements, and corresponding masks are defined according to the design of the circuit layouts. Then, different semiconductor layers are consecutively formed on the wafer by respectively using different masks so as to define different layout layers (such as doped regions, polysilicon layers, oxide layers, or different metal layers). These layout layers form various circuits so as to implement different circuit functions of each circuit in the chip.

If the chip fails to achieve expected performance, the circuit layouts must be redesigned to improve the circuit function. With the adjustment of the circuit layouts, however, the layout design of the masks must be changed correspondingly. The modification of the masks undoubtedly increases the cost and time of manufacturing and designing chips. In other words, if fewer masks are redesigned for implementing different circuit functions, the cost and time of manufacturing the chips are dramatically reduced.

Please refer to FIG. 1, which is a schematic diagram of a conventional layout design of a chip. Generally, chips include kernel (core) circuits and peripheral interface circuits, where a kernel circuit is responsible for executing main functions, such as logical operations, and the peripheral interface circuits include different I/O circuits for outputting the operation results of the kernel circuit, or for receiving input signals and converting the input signals into signals suitable for the kernel circuit. As shown in FIG. 1, a chip 10 includes a kernel circuit 12, and a plurality of I/O circuits 14A to 14C which function as interface circuits.

Generally speaking, different chips require different I/O functions. In most cases, even a single chip requires different I/O pins for implementing different I/O functions. For example, the Schmidt trigger function (noise-proof function) is a basic requirement for some certain kinds of chips. In addition, some chips can only tolerate I/O signals with a certain power, driving current, or response speed (such as slew rate). Accordingly, the I/O circuits of these kinds chips have to be particularly designed. For example, the I/O circuit with a high driving current can be realized by designing a larger doped region (doped well).

In order to design and realize various kinds of I/O functions, a database, in which different layout designs for various sub-circuit cells are recorded, is typically adopted to support different I/O functions where necessary. When a user (layout designer) has to realize a circuit with a certain I/O function, a sub-circuit cell layout, which fulfills the requirement of the certain I/O function, can be obtained by accessing the database. Therefore, the layout designer can easily realize the layout of the chip by applying the like layout design. FIG. 1 illustrates a case of applying a database 16. The database 16 includes different layout designs of various sub-circuit cells 18A to 18C (here 18A to 18C are only explanatory examples, a typical database may have more than three hundred layout designs), and each sub-circuit cell 18A to 18C has a different layout design and transistor arrangement so as to support different I/O functions. For example, the transistors of the sub-circuit cell 18B may have a larger doped region and a broader channel so as to provide a larger driving current than the sub-circuit cell 18A. The sub-circuit cell 18C supports the Schmidt trigger function with its complex transistor arrangement. In addition, each sub-circuit cell 18A to 18C has a transmission terminal 19A to 19C for respectively connecting to the kernel circuit 12.

Assuming that the I/O functions that the I/O circuits 14A to 14C require can be respectively implemented by the sub-circuit cells 18A to 18C, the layout designer just needs to respectively apply the layout designs of the sub-circuit cells 18A to 18C to the I/O circuits 14A to 14C, and couple the kernel circuit 12 with the transmission terminals 19A to 19C of each sub-circuit cell 18A to 18C respectively by connection layouts. Accordingly, in this way the kernel circuit 12 and the I/O circuits 14A to 14C are configured.

However, conventional circuit design is not perfect, and one of the disadvantages is that numerous masks have to be redesigned. For example, if the layout designer finds the I/O circuit 14B has unexpected noise, and attempts to replace the I/O circuit 14B with other noise-proof I/O circuits, the layout designer can retrieve other suitable layout designs in the database 16. Nevertheless, the problem is that once the layout design of the I/O circuit is changed, the layouts of related masks have to be correspondingly changed. Consequently, the time and cost of manufacturing and designing the chips cannot be reduced.

Please refer to FIG. 2, which is a schematic diagram of another conventional layout design of a chip. Likewise, various layout designs contained in a database 26 are used for implementing I/O circuits 24A to 24C in a chip 20. What differs from the previous example is that each sub-circuit cell of the database 26 has a limited programmable ability. This means each sub-circuit cell can perform different I/O functions. For example, the sub-circuit cell 28A can be selected to provide two different I/O functions. In addition to a transmission terminal 29A, the sub-circuit cell 28A further includes a control terminal 27A for receiving a programming signal. If the control terminal 27A receives a programming signal consistent with a first predetermined value (for example, the voltage of the programming signal is kept at a first constant), the sub-circuit cell 28A will provide the first I/O function (such as providing a smaller driving current). On the other hand, if the control terminal 27A receives a programming signal consistent with a second predetermined value, the sub-circuit cell 28A will provide the second I/O function (such as providing a larger driving current). Similarly, the sub-circuit cell 28B can provide another limited programmable ability by adopting another transistor arrangement. In addition to a transmission terminal 29B, the sub-circuit cell 28B further includes two control terminals 27B and 27C for selecting the required I/O function. Normally, the control terminal enables or disables some circuits of a sub-circuit cell so that the sub-circuit cell can selectively provide more than one I/O function.

When different I/O functions need to be realized in the chip 20, the layout designer has to apply available layout designs in the database 26, and design proper control terminals for programming the required I/O function to each sub-circuit cell. For example, assuming that the I/O circuits 24A and 24B require different I/O functions, and these two I/O functions happen to be two I/O functions that the sub-circuit cell 28A supports, the layout designer can easily realize these two I/O functions by applying the layout design of the sub-circuit cell 28A. Certainly, in addition to the connection layouts between the kernel circuit 22 and the I/O circuits 24A and 24B, the layout designer has to further arrange two connection layouts 23A and 23B of the control terminals so that the I/O circuits 24A and 24B can respectively receive different control signals. Normally, the control terminal can receive the control signal coming from the kernel circuit, or alternatively the control terminal can be connected to a DC bias voltage (such as $V_{dd}$ or $V_{gnd}$).

However, if other I/O circuits require different I/O functions that the sub-circuit cell 28A does not support, the layout designer still has to select other available sub-circuit cells capable of supporting the required I/O functions.

Although the conventional layout design shown in FIG. 2 can realize different I/O functions with the same sub-circuit cell, this layout design still has the same disadvantage. Assuming that an I/O circuit is beyond the expected performance, the layout designer has to choose other sub-circuit cells in the database 26. Since each sub-circuit cell has different transistor arrangements, related masks have to be redesigned if different sub-circuit cells are selected. If the required I/O function happens to be the other I/O function that the same sub-circuit cell supports, only the connection layout of the control terminal has to be redesigned. Regardless, the control terminal of each sub-circuit cell unavoidably occupies the circuit layout area, and this makes the circuit layout more complicated.

SUMMARY OF INVENTION

It is therefore a primary objective of the present invention to provide a chip with programmable I/O circuits and related method for solving the aforementioned problems.

According to a preferred embodiment of the present invention, a chip having a plurality of multi-function programmable sub-circuit cells including different sub-circuit blocks is disclosed. Each sub-circuit block is enabled or disabled by using the layout of a connection layout layer (such as a metal layer), such that each sub-circuit cell can provide different I/O functions. Specifically, the present invention can select different I/O functions only by altering the layout of the connection layout layer. Accordingly, only the mask of forming the layout of the connection layout layer needs to be changed. Consequently, the time and cost of manufacturing and designing chips are effectively economized.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
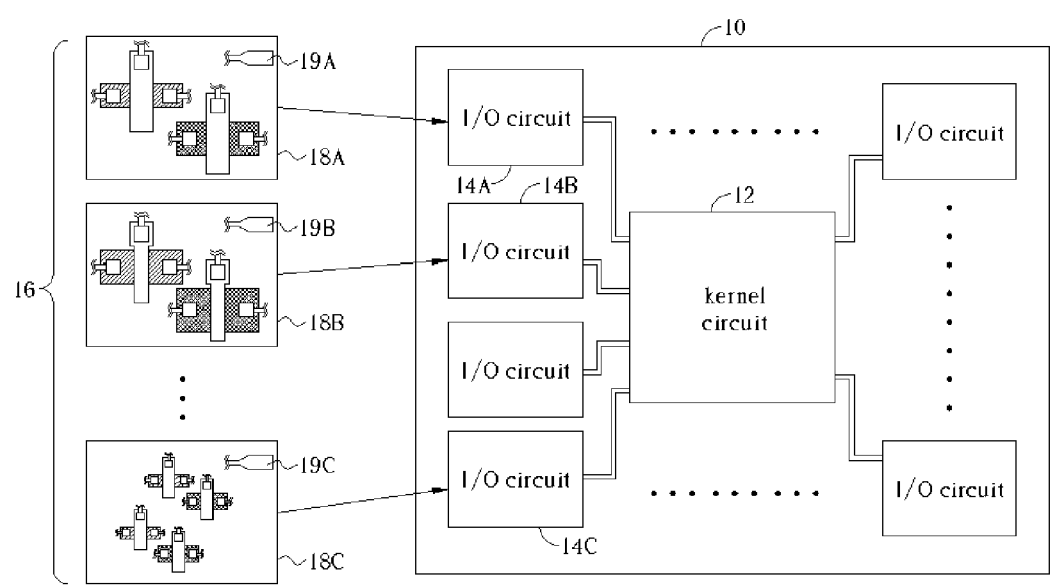
FIG. 1 and FIG. 2 are schematic diagrams of two conventional layout designs of a chip.
Figure 2:
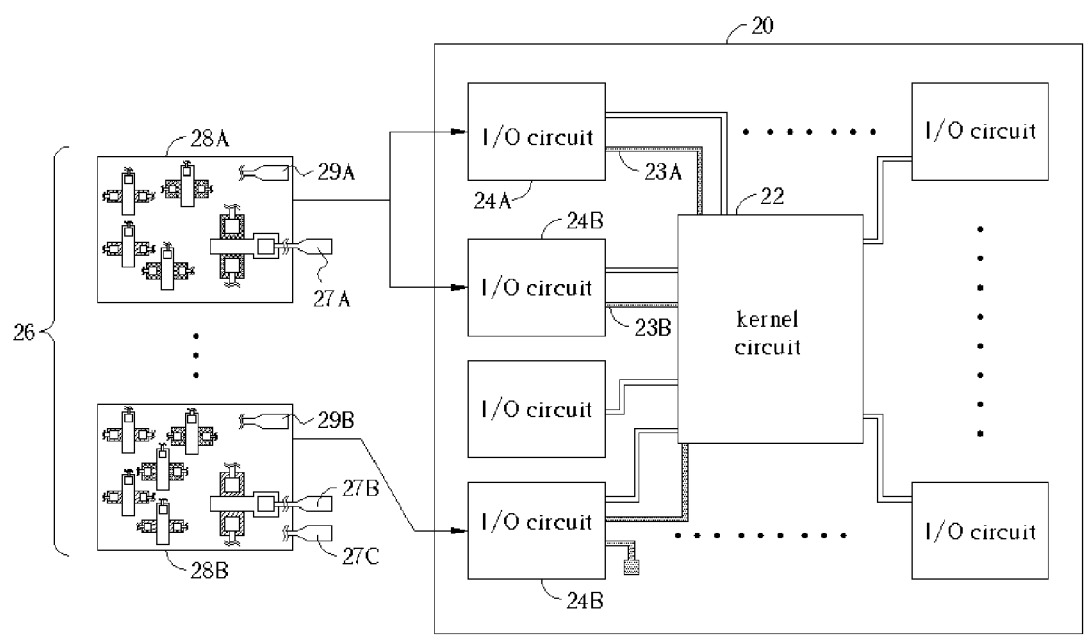
Figure 3:
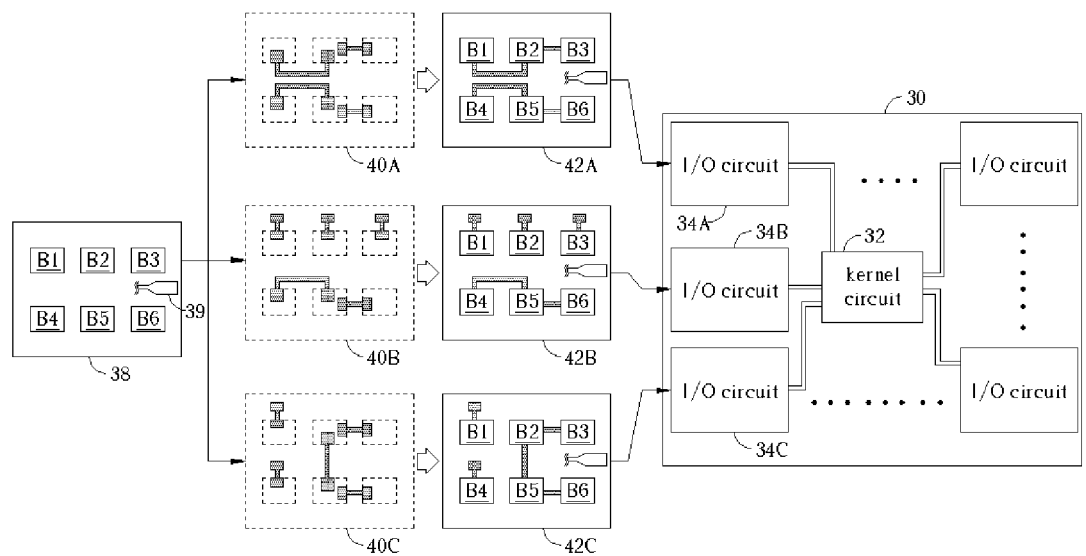
FIG. 3 is a schematic diagram illustrating how different I/O functions are realized with a sub-circuit cell according to a preferred embodiment of the present invention.

Please refer to FIG. 3, which is a schematic diagram illustrating how different I/O functions are realized with sub-circuit cells according to a preferred embodiment of the present invention. In this preferred embodiment, a sub-circuit cell 38 including a plurality of sub-circuit blocks (as B1 to B6 shown in FIG. 3) is provided. With various transistors included in respective sub-circuit block, the sub-circuit cell 38 can selectively realizes different I/O functions. When the sub-circuit blocks are connected in different ways, or certain sub-circuit blocks are enabled or disabled, the sub-circuit cell 38 can implement different I/O functions. In other words, the present invention can implement different I/O functions with several sub-circuit cells by changing only the connection layout layer between different sub-circuit blocks and all the functions are provided according to how many sub-circuit cells with different function are embedded. Furthermore, if the connections between different sub-circuit blocks are carried out by a single connection layout layer (such as a metal layer), the I/O function of each sub-circuit cell can be modified by simply redesigning the connection layout layer (i.e. the layout of a single mask). Consequently, the cost is dramatically reduced. In addition, it is also easier and faster for users to revise the circuit.

In a preferable condition, the sub-circuit cell 38 can implement various I/O functions by enabling/disabling different sub-circuit blocks, or connecting the sub-circuit blocks in different ways. In such a case, I/O circuits with a Schmidt trigger function, different powers, different driving currents, or different slew rates can be accomplished. As shown in FIG. 3, when a connection layout 40A is adopted, each sub-circuit block of the sub-circuit cell 38 are connected in a way so as to form a circuit 42A that can provide a specific I/O function. Similarly, when a connection layout 40B is adopted, the sub-circuit blocks are connected, enabled, or disabled in another way so as to form a circuit 42B. For example, some sub-circuit blocks may be connected to a DC bias voltage of the chip 30 (such as $V_{dd}$ or $V_{gnd}$) and therefore are enabled or disabled). Likewise, another connection layout 40C can also be selected to form a circuit 42C having a different I/O function from those of the circuits 42A and 42B.

Assuming that the layout designer needs three different I/O circuits, which respectively have different I/O functions, for being interface circuits of a kernel circuit 32, and these three different I/O functions can be therefore respectively provided by the circuit 42A, 42B, and 42C. In such a case, the layout designer can realize the I/O circuit 34A by applying the layout design of the sub-circuit cell 38 with the connection layout 40A. Similarly, the I/O circuits 34B and 34C can be implemented by respectively applying the layout design of the circuit cell 38 with the connection layout 40B and with the connection layout 40C. Of course, the transmission terminal 39 of each I/O circuit has to be connected to the kernel circuit 32 for communicating the interface circuits and the kernel circuit 32 together.

It can be seen that the spirit of the layout design according to the present invention is to design a plurality of sub-circuit cells accompanied by different connection layout designs (i.e. a database of connection layouts) so as to provide different I/O functions. When a certain I/O function is required, the layout designer only has to select the specific layout of the connection layout layer so that the sub-circuit cell 38 can provide the required I/O function. In other words, the present invention can implement any different I/O function by only redesigning the layout of the mask used to define the connection layout layer.

Figure 4:
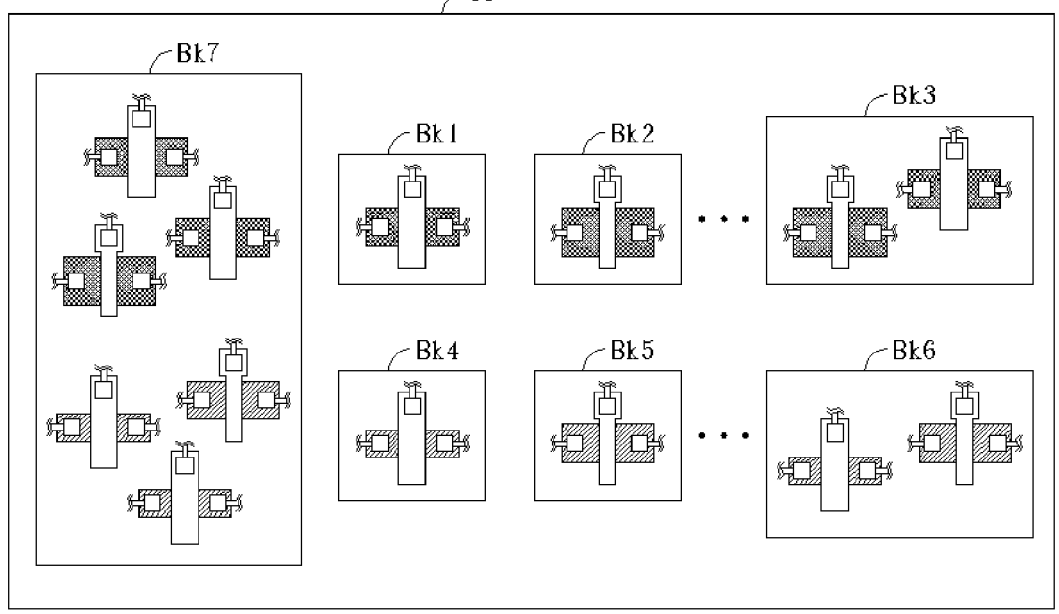
FIG. 4 is a schematic diagram of the sub-circuit cell shown in FIG. 3.

Please refer to FIG. 4 together with FIG. 3. FIG. 4 is a schematic diagram of the sub-circuit cell 38 shown in FIG. 3. As described, the sub-circuit blocks of the sub-circuit cell 38 can be connected in different ways for implementing different I/O functions. As shown in FIG. 4, the sub-circuit cell 38 includes six sub-circuit blocks Bk1 to Bk6, and each sub-circuit block has at least a transistor (such as an N-type MOS or a P-type MOS). Each transistor has a doped region with different areas. When these transistors with different doped areas are connected together via the connection layout layer, a high driving current, a high power, or a high slew rate I/O function can be performed. On the contrary, a low driving current I/O function can also be achieved by reducing the quantities of transistors connected together. In such a case, the sub-circuit blocks, which are not connected together, are short-circuited to DC bias voltages of the chip (such as $V_{dd}$ or $V_{gnd}$) and are thus disabled. The short-circuited circuits can additionally prevent the chip from being damaged by electrostatic discharge (ESD).

In addition, the sub-circuit cell 38 can further include specific sub-circuit blocks (such as Bk7 shown in FIG. 4) for providing specific I/O functions. For example, the sub-circuit block Bk7 has a particular transistor arrangement for supporting a Schmidt trigger function. In other words, if the sub-circuit block Bk7 is connected and enabled via the connection layout, the sub-circuit cell 38 can therefore support a Schmidt trigger I/O function.

Currently, a single sub-circuit cell capable of supporting hundreds of I/O functions has been designed according to the present invention. By altering the layout of the connection layout layer, the sub-circuit cell can provide various driving currents (such as 16 mA, 8 mA, 4 mA, 2 mA, etc.), different slew rates (such as 0.1 ns, 0.4 ns, 0.8 ns, etc.), a Schmidt function, pull-up/down driving functions, or an open drain function. In the preferred embodiment, the second metal layer (metal two layer) of the chip is selected as the connection layout layer so that the required I/O function can be decided by programming the connection layout of the second metal layer. It is to be noted that a plurality of circuits having different I/O functions are contained in a chip, other metal layers may also be selected to form a multiple connection layout layer where necessary. In addition, all the functions are available in a chip and the only change is the connection layout layer. It is easier for both users to revise the chip and vendors to maintain the database.

In comparison with the prior art, the present invention is able to implement various I/O functions with the layout of a single circuit by programming the layout of a connection layout layer. Consequently, the modification of masks can be reduced to a minimum. In addition, since no control terminals are required, the layout design of the sub-circuit cell is more flexible.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method for implementing circuit layouts in a chip, comprising:

forming a plurality of sub-circuit cells with the same layout in different positions of the chip, where each sub-circuit cell comprising a plurality of sub-circuit blocks and a transmission terminal, each sub-circuit block comprises at least two N-type MOS transistors or P-type MOS transistors which have doped regions with different areas, wherein the sub-circuit cells in different positions are for implementing input/output (I/O) circuit with different I/O functions;

when the sub-circuit cells in different positions require different circuit functions, performing a layout programming in at least a connection layer so that different layouts are formed in different positions of the connection layer corresponding to the sub-circuit cells, wherein each layout in the connection layer corresponding to each sub-circuit cell creates a connection between some of the sub-circuit blocks within each corresponding sub-circuit cell by selectively connecting the sub-circuit blocks within each corresponding sub-circuit cell so that the sub-circuit cells in different positions implement different circuit functions.

2. The method of claim 1, wherein the connection layer is a metal layer.

3. The method of claim 1, the layout programming is only performed in the connection layer so that the sub-circuit cells with different circuit functions have different layouts only in the connection layer.

4. The method of claim 1, wherein the sub-circuit cells in different positions are for implementing I/O circuits with a Schmidt trigger function.

5. The method of claim 1, wherein the sub-circuit cells in different positions are for implementing I/O circuits with different slew rates.

6. The method of claim 1, wherein the sub-circuit cells in different positions are for implementing I/O circuits with different driving currents.

7. A chip, comprising:

a plurality of layout layers comprising a plurality of same layouts in a plurality of positions of the layout layers so as to implement a plurality of sub-circuit cells with the same layout, each sub-circuit cell comprising a plurality of sub-circuit blocks and a transmission terminal and each sub-circuit block comprises at least two N-type MOS transistors or P-type MOS transistors which have doped regions with different areas;

at least a connection layer comprising different layouts corresponding to the different positions of the layout layers, wherein each layout of the connection layer creates a connection between some of the sub-circuit blocks within each corresponding sub-circuit cell, so that the sub-circuit cells in different positions implement different circuit functions, wherein the connection layer implements input/output (I/O) circuits with different I/O functions by the sub-circuit cells in different positions.

8. The chip of claim 7, wherein the connection layer is a metal layer.

9. The chip of claim 7, wherein the connection layer implements I/O circuits with a Schmidt trigger function with the sub-circuit cells in different positions.

10. The chip of claim 7, wherein the connection layer implements I/O circuits with different slew rates with the sub-circuit cells in different positions.

11. The chip of claim 7, wherein the connection layer implements I/O circuits with different driving currents with the sub-circuit cells in different positions.

* * * * *